(12) United States Patent
Yamauchi et al.

(10) Patent No.: US 7,450,049 B2
(45) Date of Patent: Nov. 11, 2008

(54) DIGITIZATION APPARATUS

(75) Inventors: Shigenori Yamauchi, Nisshin (JP);
Takamoto Watanabe, Nagoya (JP)

(73) Assignee: Denso Corporation, Kariya (JP)

( * ) Notice: Subject to any disclaimer, the term of this patent is extended or adjusted under 35 U.S.C. 154(b) by 51 days.

(21) Appl. No.: 11/803,392

(22) Filed: May 14, 2007

(65) Prior Publication Data
US 2007/0263732 A1 Nov. 15, 2007

(30) Foreign Application Priority Data
May 15, 2006 (JP) .............................. 2006-135624
Jun. 30, 2006 (JP) .............................. 2006-181652

(51) Int. Cl.
*H03M 1/60* (2006.01)
(52) U.S. Cl. ..................... 341/157; 341/155; 341/166
(58) Field of Classification Search ................. 341/157
See application file for complete search history.

(56) References Cited

U.S. PATENT DOCUMENTS

| 5,396,247 | A | | 3/1995 | Watanabe et al. |
| 5,568,071 | A | * | 10/1996 | Hoshino et al. ............... 377/43 |
| 6,466,151 | B2 | * | 10/2002 | Nishii et al. ................. 341/155 |
| 6,509,861 | B2 | * | 1/2003 | Watanabe ................... 341/157 |
| 6,771,202 | B2 | | 8/2004 | Watanabe et al. |
| 6,850,178 | B2 | * | 2/2005 | Watanabe ................... 341/155 |
| 6,879,278 | B2 | | 4/2005 | Watanabe et al. |
| 6,940,443 | B2 | * | 9/2005 | Terazawa et al. ............ 341/157 |

FOREIGN PATENT DOCUMENTS

| JP | H05-259907 | 10/1993 |
| JP | 2004-007385 | 1/2004 |
| JP | 2004-357030 | 12/2004 |
| JP | 2006-115274 | 4/2006 |

* cited by examiner

*Primary Examiner*—Khai M Nguyen
(74) *Attorney, Agent, or Firm*—Harness, Dickey & Pierce, PLC

(57) ABSTRACT

The digitization apparatus includes, as a main scale, a pulse delay circuit constituted by a plurality of delay units connected in series or in ring form, a latch/encoder, a circulation number counter, and a latch circuit, and includes, as a vernier, a reverse timing extraction circuit detecting a reverse timing at which any one of the delay units has reversed, and an interpolation circuit. The main scale digitizes a time interval between two successive measurement signals in a resolution equal to a delay time per one delay unit. The vernier digitizes a time difference between a measurement timing indicated by the measurement signal and the reverse timing in a resolution equal to 1/M (M being an integer not smaller than 2). The interpolation circuit includes two delay lines each constituted by a plurality of delay units connected in series or in ring form.

15 Claims, 15 Drawing Sheets

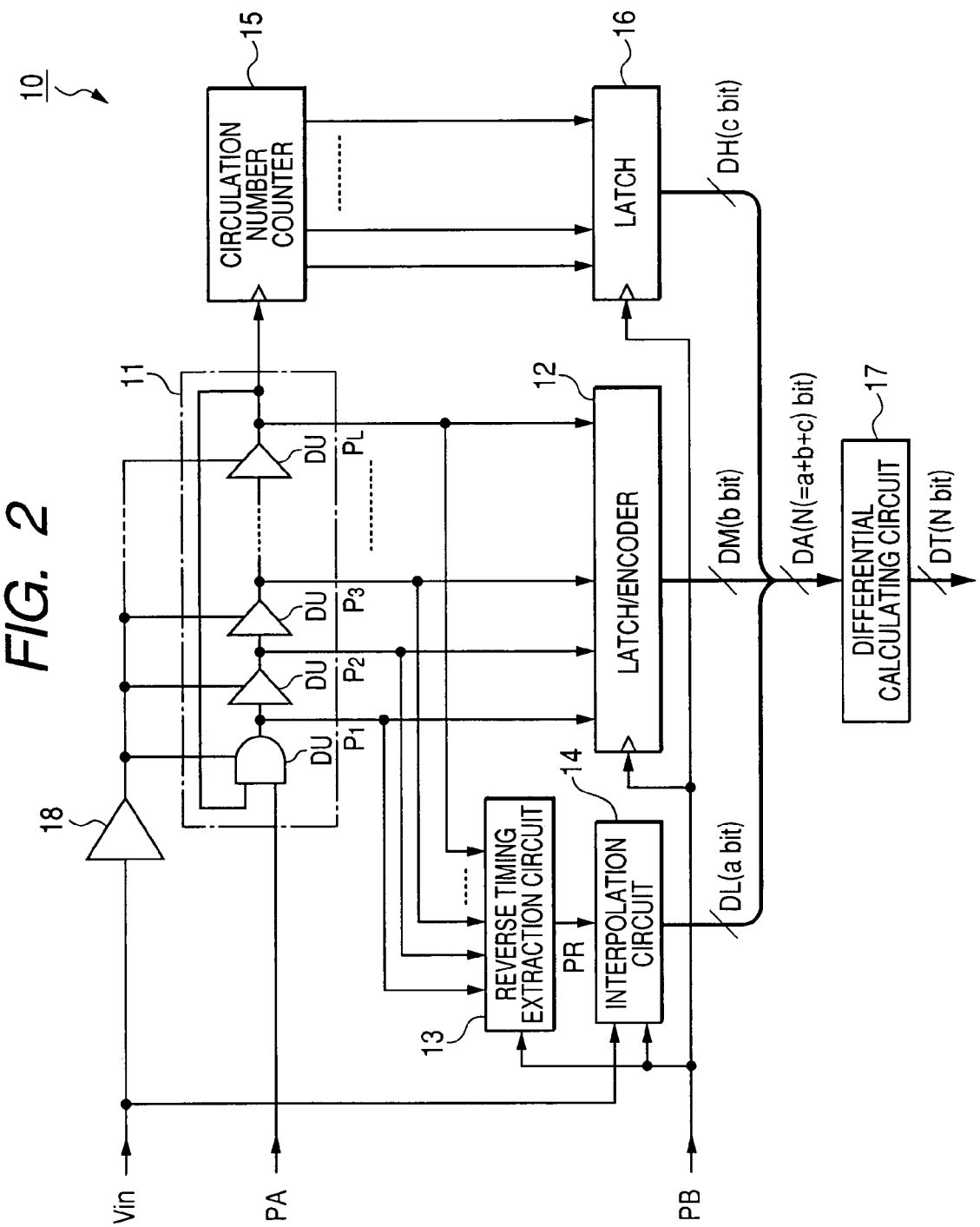

US 7,450,049 B2

DIGITIZATION APPARATUS

CROSS-REFERENCE TO RELATED APPLICATION

This application is related to Japanese Patent Applications No. 2006-135624 filed on May 15, 2006, and No. 2006-181652 filed on Jun. 30, 2006, the contents of which are hereby incorporated by reference.

BACKGROUND OF THE INVENTION

1. Field of the Invention

The present invention relates to a digitization apparatus used for digitizing a signal level of an analog signal, time intervals of pulse signals, etc.

2. Description of Related Art

One example of such a digitization apparatus is a TAD-type A/D converter (referred to simply as "TAD" hereinafter) all the parts of which are constituted by a digital circuit.

As described, for example, in Japanese Patent Application Laid-open No. 5-259907, the TAD includes a pulse delay circuit constituted by a plurality of delay units connected in series or in ring form. The delay time of these delay units depends on an operating voltage thereof. The TAD outputs the number of the delay units which a pulse signal passes through in a predetermined measuring time period as digitization data (A/D converted data) representing a voltage of an analog input signal applied to these delay units as their operating voltage.

That is to say, the TAD is configured such that a traveling speed of the pulse signal traveling through the pulse delay circuit is varied depending on the analog input signal applied to the delay units as their operating voltage, and this traveling speed is measured by counting the number of the delay units which the pulse signal passes through in the predetermined measuring time period.

The TAD can be used also as a time measuring apparatus capable of outputting data representing a length of elapsed time in digitized form, if a constant voltage signal is applied to the delay units as the analog input signal to set the delay time of the delay units at a known constant value.

In the TAD, to increase the resolution of its output digitization data (A/D converted data), the delay time of each one of the delay units has to be made shorter, or the measuring time period has to be made longer when the TAD is used as an A/D converter apparatus.

However, making the delay time of each delay unit has limitations, because the delay time is determined by a miniaturization level (CMOS design rule) of elements constituting the delay unit (gate circuits such as an inverter, for example). In addition, when it is required to drive the TAD by a low voltage for electric power saving, the delay time of the delay unit is restrained by this low driving voltage.

Furthermore, in a system using the TAD for performing A/D conversion at high speed (several MHz to several tenth of MHz, for example), it is not possible to lengthen the measuring time period to increase the resolution.

Incidentally, there is known a parallel-type (or flash-type) A/D converter capable of performing A/D conversion at high speed. However, the parallel-type A/D converter has to produce a number of reference voltages by use of analog circuits depending on the resolution required. Accordingly, in the case of the parallel-type A/D converter, increasing its output resolution causes its circuit scale to increase, and accordingly causes its production cost to increase.

SUMMARY OF THE INVENTION

The present invention provides a digitization apparatus comprising:

a pulse delay circuit constituted by a plurality of pulse delay units connected in series or in ring form, each of the pulse delay units having a delay time depending on a voltage level of an analog input signal applied thereto as a drive voltage thereof, the pulse delay circuit allowing a pulse signal to travel through the pulse delay units while being successively delayed by the delay time;

a higher coding circuit generating, upon receiving a measurement signal indicating a measurement timing from outside, digitized data representing the number of the pulse delay units which the pulse signal has passed;

a reverse timing extraction circuit extracting a timing, as a reverse timing signal, at which any one of the pulse delay units has reversed in output level for the first time after the measurement timing;

a first delay line constituted by a plurality of first delay units connected in series or in ring form, each of the first delay units having a first delay time, the first delay line allowing the reverse timing signal to travel through the first delay units while being successively delayed by the first delay time;

a second delay line constituted by a plurality of second delay units connected in series or in ring form, each of the second delay units having a second delay time larger than the first delay time by 1/M (M being an integer not smaller than 2) of the delay time of the pulse delay units, the first delay line allowing the reverse timing signal to travel through the second delay units while being successively delayed by the second delay time; and a lower coding circuit generating digitized data representing a time difference between the measurement timing and the reverse timing on the basis of the number of the first delay units which the reverse timing signal has passed when the number of the first delay units has overtaken the number of the second delay units which the measurement signal has passed;

the digitization apparatus outputting data formed by the digitized data generated by the higher coding circuit as higher bits thereof, and the digitized data generated by the lower coding circuit as lower bits thereof.

According to the present invention, it is possible to provide a digitization apparatus constituted only by digital circuits, and capable of digitizing a signal level of an analog signal, or time intervals between successive pulse-like signals at high speed and in high resolution without using any complicated analog circuits.

The first delay units and the second delay units may be applied with the analog input signal as a drive voltage thereof.

The digitization apparatus may further comprise a time measurement control apparatus generating a constant voltage signal as the analog input signal, and a start signal to cause the pulse signal to start traveling through the pulse delay units of the pulse delay circuit, the digitization apparatus outputting data representing in digitized form a time interval between a start timing indicated by the start signal and the measurement timing each time the measurement signal is inputted to the higher coding circuit.

The digitization apparatus may further comprise an A/D conversion control circuit supplying the higher coding circuit with the measurement signal at predetermined constant periods, the digitization apparatus outputting, at the measurement timing indicated by measurement signal, data representing a voltage level of the analog input signal in digitized form.

The digitization apparatus may further comprise a differential calculating circuit successively memorizing output data generated by the digitization apparatus, and calculating a difference between the output data generated previous time and the output data generated this time.

The lower coding circuit may include an edge detection circuit constituted by a plurality of flip-flop circuits provided in one-to-one relationship with the first delay units and the second delay units, each the flip-flop circuit receiving an output of a corresponding one of the first delay units at one of a data input terminal and a clock input terminal thereof, and receiving an output of a corresponding one of the second delay units at the other of the data input terminal and the clock input terminal thereof, an encoder generating stage-number data representing in digitized form a stage number of one of the flip-flop circuits which has changed an output level thereof, and a data conversion circuit converting the stage-number data to such data whose value monotonously increases with increase of a time difference between the reverse timing and the measurement timing.

The data conversion circuit may perform at least one of elimination of offset contained in the stage-number data, and correction of a gain error of the stage-number data.

The digitization apparatus may further comprise a test signal generating circuit having a function of generating the analog input signal, and generating the measurement signal in continuously changing period, and a correction data calculating circuit calculating correction data needed for the data conversion circuit to perform elimination of the offset or correction of the gain error on the basis of the stage-number data outputted from the encoder when the digitization apparatus operates on the analog input signal, and the measurement signal generated by the test signal generating circuit.

A delay circuit having the same characteristic with respect to at least one of drive voltage and ambient temperature with the pulse delay units may be provided in an input side of the second delay line.

The digitization apparatus may further comprise a first D/A converter generating, from adjustable digital set value, an adjustable drive voltage to be supplied to the first delay units, and a second D/A converter generating, from adjustable digital set value, an adjustable drive voltage to be supplied to the second delay units.

Each of the pulse delay units may be constituted by a series connection of a plurality of inverter gate circuits.

The inverter gate circuit may be a CMOS inverter gate circuit. In this case, preferably, the drive voltage of the pulse delay unit is set at a value smaller than a sum of a threshold voltage of an N-channel transistor and a threshold voltage of a P-channel transistor, which constitute the CMOS inverter gate circuit.

The reverse timing extraction circuit may include latch circuits latching the measurement signal respectively in synchronization with outputs of the pulse delay units constituting the pulse delay circuit, and an OR circuit outputting a logical sum of outputs of the latch circuits as the reverse timing signal.

Other advantages and features of the invention will become apparent from the following description including the drawings and claims.

BRIEF DESCRIPTION OF THE DRAWINGS

In the accompanying drawings:

FIG. 2 is a block diagram showing a structure of the digitization section shown FIG. 1A;

PREFERRED EMBODIMENTS OF THE INVENTION

First Embodiment

Figure 1A:
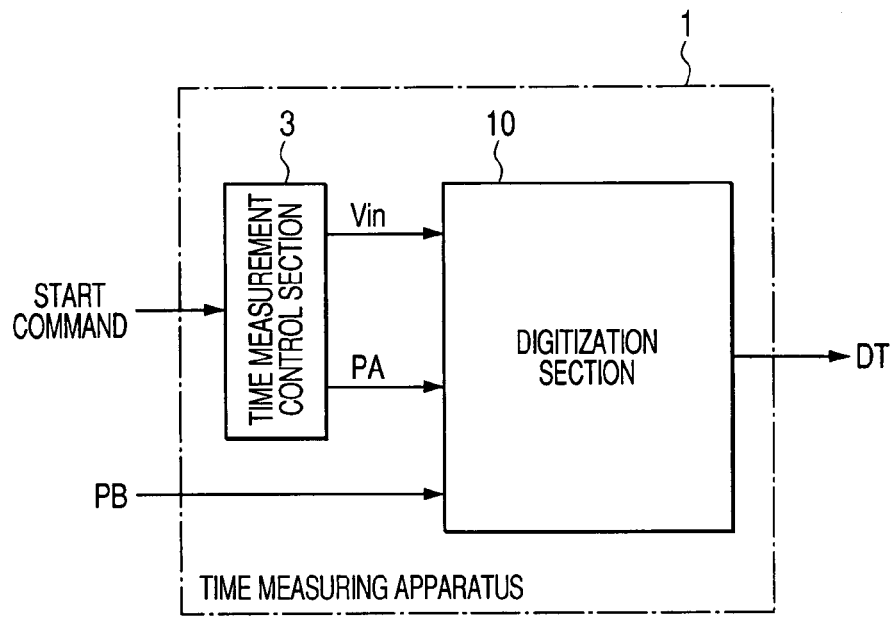
FIG. 1A is a block diagram showing an overall structure of a time measuring apparatus including a digitization section according to a first embodiment of the invention.
Figure 1B:
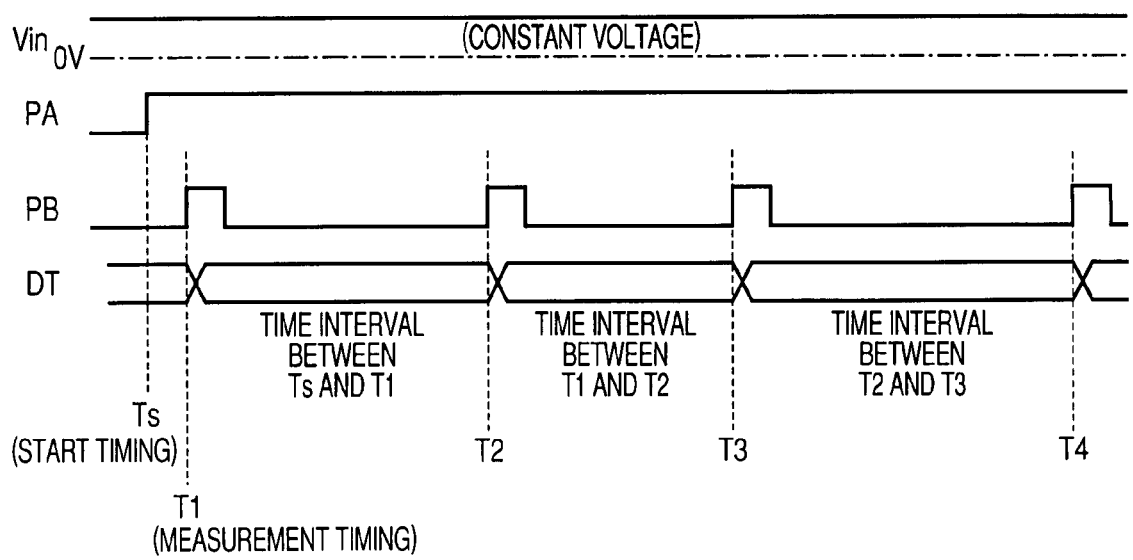
FIG. 1B is a timing diagram showing the operation of the time measuring apparatus shown in FIG. 1A.

FIG. 1A is a block diagram showing an overall structure of a time measuring apparatus 1 including a digitization section 10 according to a first embodiment of the invention. FIG. 1B is a timing diagram showing the operation of the time measuring apparatus 1.

As shown in this figure, the time measuring apparatus 1 is constituted by the digitization section 10 and a time measurement control section 3. The time measurement control section 3 generates an analog input signal Vin of constant voltage (5V, in this embodiment), and a start signal PA which changes from a non-active level (low level in this embodiment) to an active level (high level in this embodiment) in response to a start command supplied from the outside of the time measuring apparatus 1. The digitization section 10 receives, in addition to the analog input signal Vin of constant voltage and the start signal PA generated by the time measurement control section 3, a pulse-like measurement signal PB which rises at measurement timings Ti (i=1, 2, 3 . . . ) as shown in FIG. 1B. The digitization section 10 is configured such that, when being supplied with the measurement signal PB after the start signal PA has changed to the active level at a start timing Ts, the digitization section 10 measures a time interval between the start timing Ts and a first measurement timing T1, or a time interval between a previous time measurement timing Ti−1 and this time measurement timing T1, and outputs data DT representing the measured time interval in digitized form.

FIG. 2 is a block diagram showing a structure of the digitization section 10. As shown in this figure, the digitization section 10 includes a pulse delay line 11, a latch/encoder 12, a circulation number counter 15, and a latch circuit 16. The pulse delay line 11 is constituted by L (L=$2^b$, b being a positive integer) delay units DU connected in ring form to operate as a ring delay line through which a pulse signal circulates when the start signal PA is inputted, each of the delay units DU delaying its input signal (the pulse signal) by a delay time Td. The latch/encoder 12 latches the outputs P1 to PL of the delay units DU at the measurement timing Ti of the measurement signal PB, and outputs b-bit digital data (may be referred to as "middle data" hereinafter) DM representing in what stage number of the delay units DU the pulse signal is. The circulation number counter 15 is a c (c being a positive integer)-bit counter counting the output (the circulating pulse signal) of a final stage delay unit DU. The latch circuit 16 operates to latch the count value of the circulation number counter 15 at the measurement timing, and outputs c-bit digital data (may be referred to as "higher data" hereinafter) DH representing the latched count value.

Figure 3:
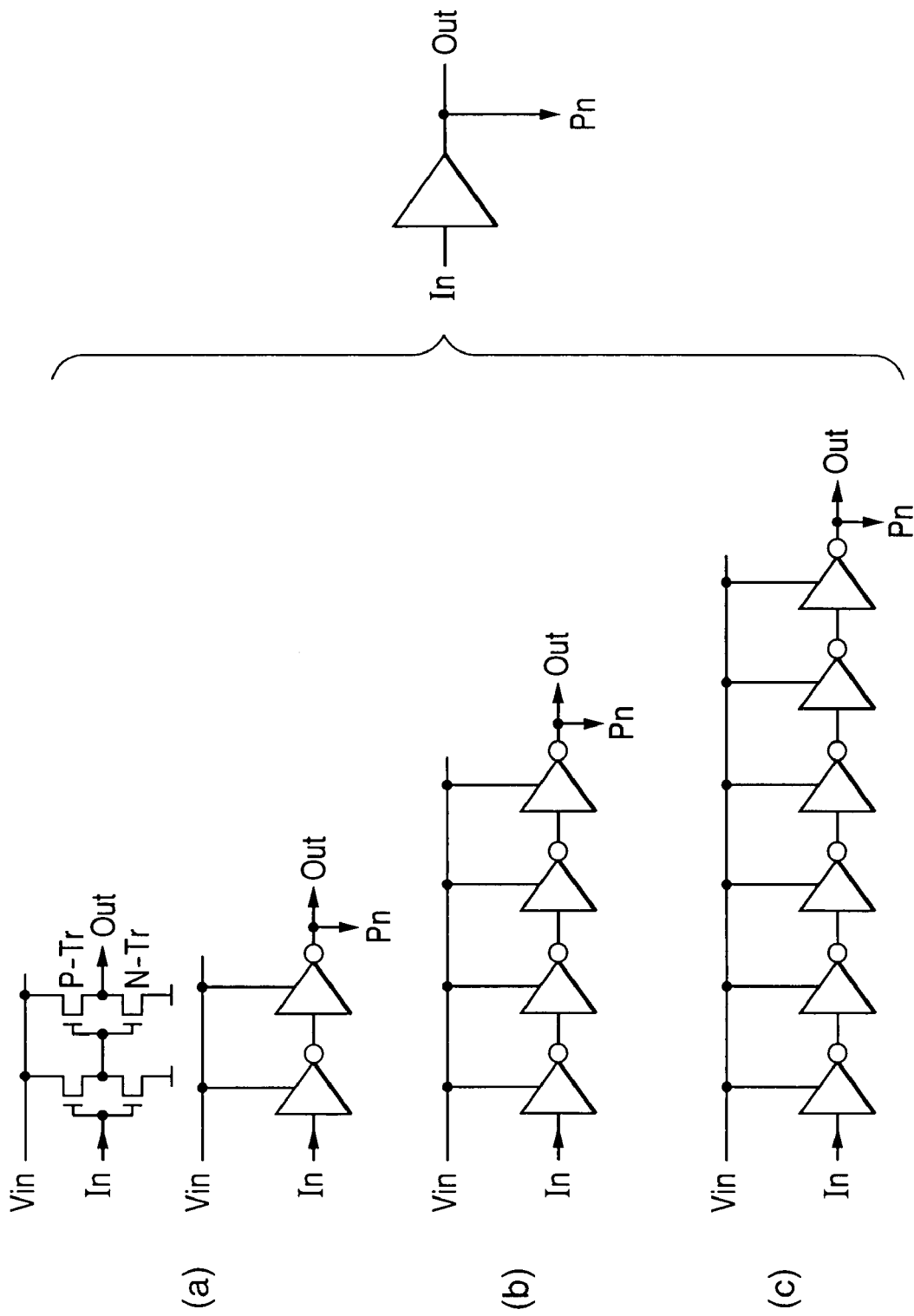
FIG. 3 is a diagram explaining a structure of a delay unit constituting a pulse delay circuit included in the digitization section shown in FIG. 2.

As shown in (a) of FIG. 3, each of the delay units DU is a buffer circuit constituted by a serial connection of two CMOS inverter gate circuits, with exception that the first stage delay unit DU is constituted by an AND gate circuit one of two input terminals of which is a starting terminal.

The other input terminal of the first stage delay unit DU is connected to an output terminal of the final stage delay unit DU so that the delay units DU form a ring delay line. Although not shown in the figures, the pulse delay circuit 11 has means for adjusting the signal level at the input terminal of the first stage delay unit DU to enable the pulse signal to continue to circulate in the pulse delay circuit 11. Since the structure of the pulse delay circuit as described above is disclosed in detail, for example, in Japanese Patent Application Laid-open No. 6-216721, further explanation thereof is omitted here.

Each of the delay units DU is applied with, as its drive voltage, the analog input signal Vin supplied from the time measurement control section 3 through a buffer circuit 18. Accordingly, the delay time of each delay unit DU varies depending on the voltage level of the analog input signal Vin.

However, in this embodiment, the voltage level of the analog input signal Vin is kept constant, and accordingly, the delay time of each delay unit DU is constant. Therefore, the number of the delay units DU which the pulse signal passes through varies in proportion to a time period between the start timing Ts and the measurement timing Ti.

The pulse delay circuit 11 further includes a reverse timing extraction circuit 13, an interpolation circuit 14, and a differential calculating circuit 17. The reverse timing extraction circuit 13 generates a reverse timing signal PR representing a timing at which any one of the outputs P1 to PL of the delay units DU has reversed for the first time since the measurement signal PB was inputted. The interpolation circuit 14 outputs a-bit (a being a positive integer) digital data DL (may be referred to as "lower data" hereinafter) representing a time differential between a reverse timing indicated by the reverse timing signal PR and a measurement timing indicated by the measurement signal PB in a resolution M (M=$2^a$,) times finer than the middle data DM outputted from the latch/encoder 12. The differential calculating circuit 17 successively memorizes, as absolute value data DA representing the time interval between the start timing Ts and the measurement timing Ti, N-bit data (N=a+b+c) which is formed by the lower data DL received as lower bits from the interpolation circuit 14, the middle data DM received as middle bits from the latch/encoder 12, and the higher data DH received as higher bits from the latch circuit 16, calculates a difference between the absolute value data DA memorized at previous time and the absolute value data DA memorized this time, and generates N-bit data DT representing a time interval between the preceding measurement timing Ti−1 and the current measurement timing Ti.

Figure 4:
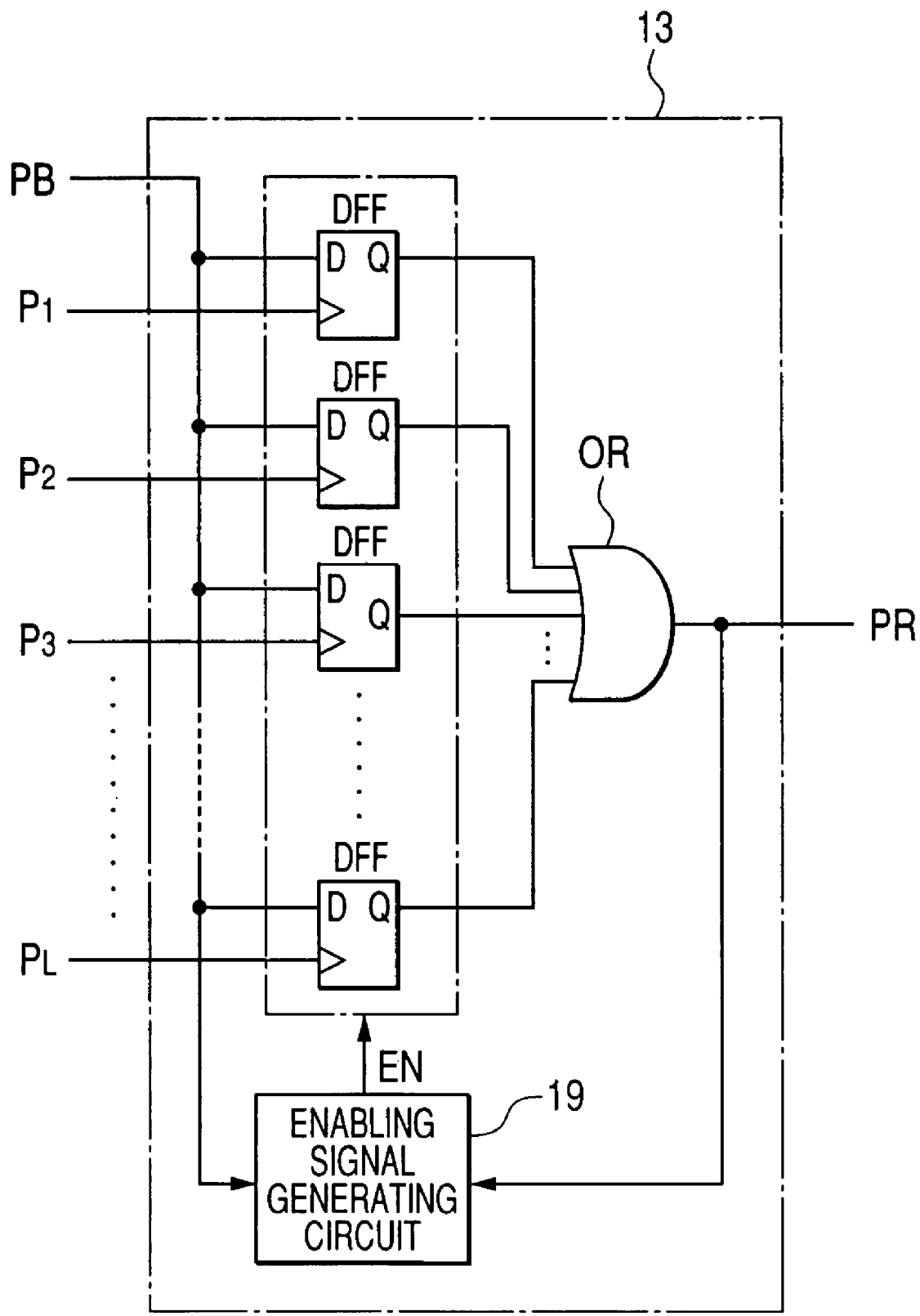
FIG. 4 is a circuit diagram of a reverse timing extraction circuit included in the digitization section shown in FIG. 2.

As shown in FIG. 4, the reverse timing extraction circuit 13 includes L flip-flop circuits DFF, an OR circuit OR, and an enabling signal generating circuit 19. The L flip-flop circuits DFF commonly receive the measurement signal PB at their data input terminals, and respectively receive the outputs P1 to PL of the delay units DU constituting the pulse delay circuit 11 at their clock input terminals. The OR circuit OR receives the outputs of the L flip-flop circuits DFF, and generates the reverse timing signal PR to be supplied to the interpolation circuit 14. The enabling signal generating circuit 19 generates an enabling signal EN which causes the flip-flop circuits DFF to reset their outputs at the rising edge of the measurement signal PB (that is, at the measurement timing Ti), and causes the flip-flop circuits DFF to perform their latch operations until the reverse timing signal PR rises.

As understood from the above, the reverse timing signal PR rises at a timing when any one of the outputs of the flip-flop circuits DFF rises for the first time (actually, it is lagged due to the delays in the flip-flop circuits DFF and the OR circuit OR) after the measurement signal PB rises (that is, after the current measurement timing Ti), and stays in this state until the measurement signal PB rises next (until the succeeding measurement timing Ti+1).

Figure 5:
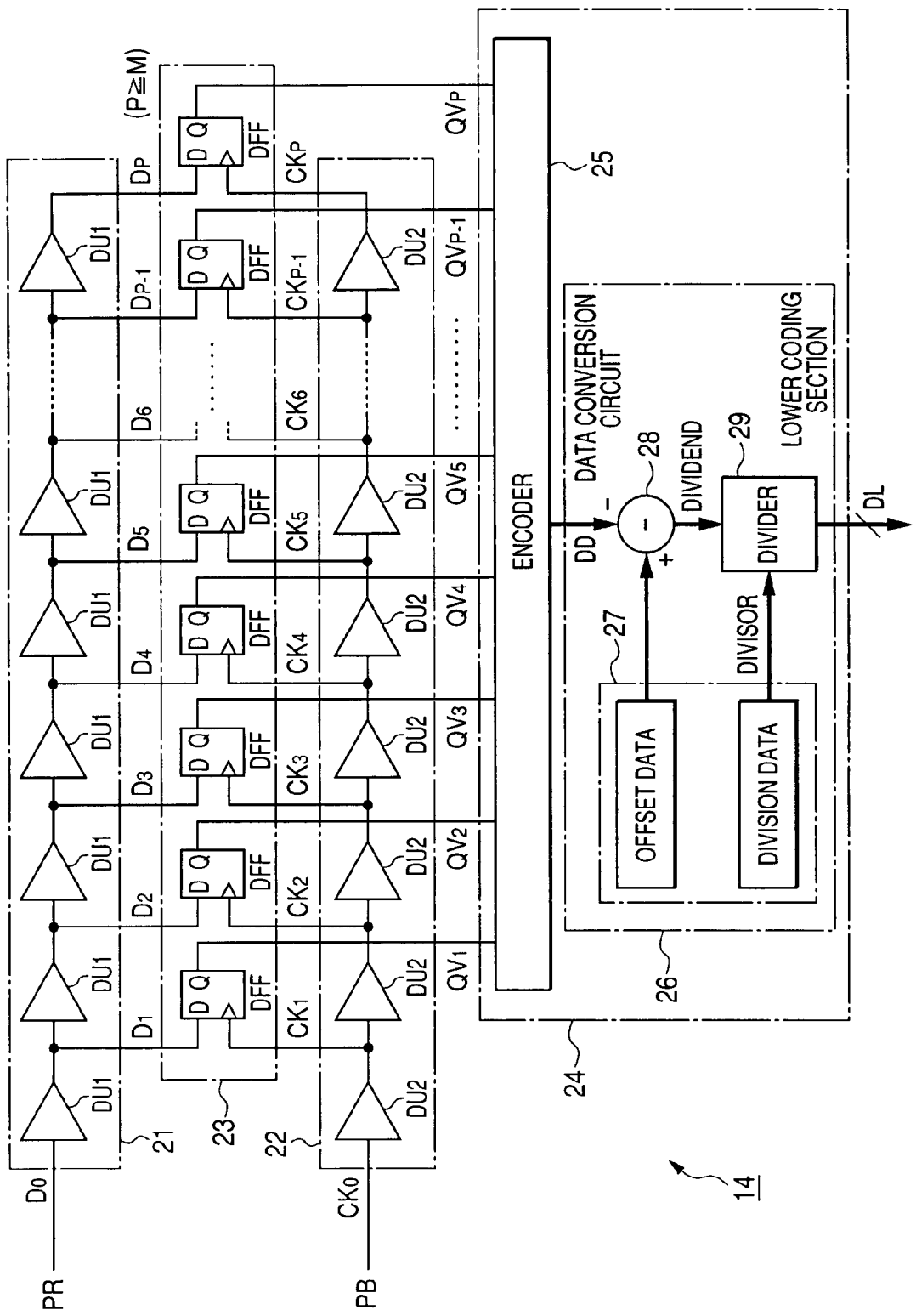
FIG. 5 is a diagram showing a structure of an interpolation circuit included in the digitization section shown in FIG. 2.

As shown in FIG. 5, the interpolation circuit 14 includes a first delay line 21, a second delay line 22, an edge detection circuit 23, and a lower coding section 24. The first delay line 21, which is constituted by a series connection of P (P≧M) delay units DU1 each of which delays its input signal by a predetermined delay time Td1, receives the reverse timing signal PR outputted from the reverse timing extraction circuit 13. The second delay line 22, which is constituted by a series connection of P delay units DU2 each of which delays its input signal by a predetermined delay time Td2, receives the measurement signal PB. The edge detection circuit 23 is constituted by P flip-flop circuits DFF, the p-th stage (p=1, 2, . . . , P) flip-flop circuit receiving the output Dp of the p-th stage delay unit DU1 of the first delay line 21 at its data input terminal, and receiving the output CKp of the p-th stage delay unit DU2 of the second delay line 22 at its clock input terminal. The lower coding section 24 generates the lower data DL representing the time differential between the measurement timing and the reverse timing on the basis of the outputs QV1 to QVP of the flip-flop circuits DFF constituting the edge detection circuit 23.

Although not shown in this figure, the delay units DU1 constituting the first delay line 21 and the delay units DU2 constituting the second delay line 22 are applied with the analog input signal Vin as their drive voltage like the delay units DU constituting the pulse delay circuit 11.

The delay time Td2 of the delay units DU2 constituting the second delay line 22 is larger than the delay time Td1 of the delay units DU1 constituting the first delay line 21 by 1/M of the delay time Td of the delay units DU constituting the pulse delay circuit 11.

That is, the following equation (1) holds.

$$Td2 = Td1 + Td/M \quad (1)$$

In this embodiment, Td1 equals to Td, and M equals to 16 (that is, a=4).

Figure 6:
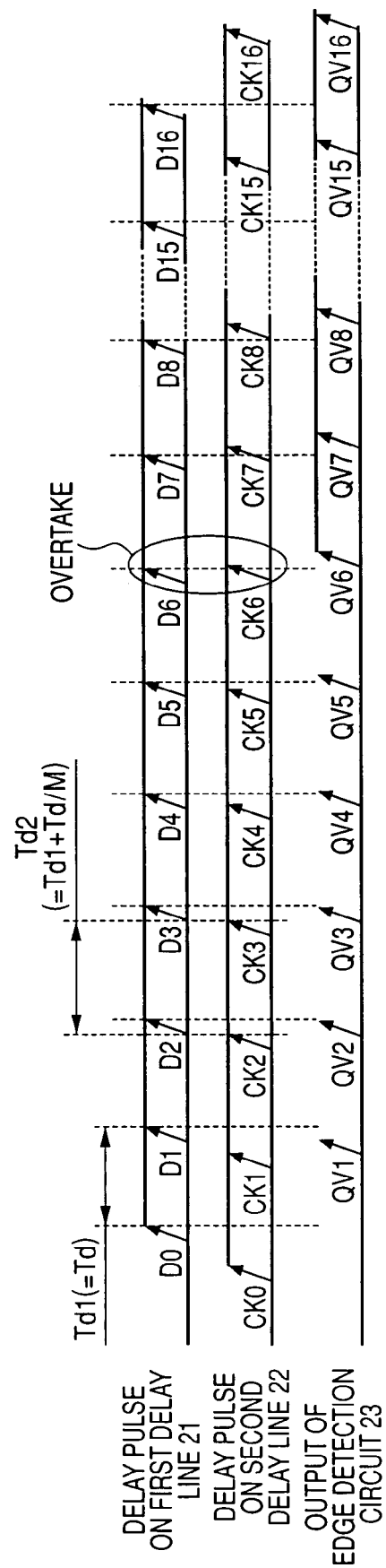
FIG. 6 is a timing diagram explaining the operation of the interpolation circuit shown in FIG. 5.

As shown in FIG. 6, the reverse timing signal PR is inputted to the first delay line 21 at a timing lagging behind a timing at which the measurement signal PB is inputted to the second delay line 22 (the lagging time is not larger than the delay time Td). Since the delay times of the delay units DU1 and DU2 are in the relationship shown in the equation (1), the delayed pulse resulting from the reverse timing signal PR (may be referred to as a first delay pulse hereinafter) overtakes the delayed pulse originating from the measurement signal PB (may be referred to as a second delay pulse hereinafter) at a moment when it passes through the M-th stage delay unit DU1.

At this time, the output QVp of the p-th stage flip-flop circuit DFF constituting the edge detection circuit 23 is at the low level if the delayed pulse on the first delay line 21 does not yet overtake the delayed pulse on the second delay line 22, and otherwise at the high level.

Returning back to FIG. 5, the lower coding section 24 includes an encoder 25, and a data conversion circuit 26. The encoder 25 generates stage-number data representing the numbers of the delay units DU1 and DU2 which the above first and second delay pulses have passed before the first delay pulses overtakes the second delay pulse on the basis of the outputs QV1 to QVp of the flip-flop circuits DFF of the edge detection circuit 23. The data conversion circuit 26 corrects the stage-number data generated by the encoder 25 to generate the lower data DL.

The data conversion circuit 26 is constituted by a memory 27, a subtracter 28, and a divider 29. The memory 27 is for storing offset data and division data to be explained later. The subtracter 28 is for subtracting the stage-number data DD generated by the encoder 25 from the offset data stored in the memory 27. The divider 29 is for dividing the subtraction result (may be referred to as "first correction data HD1" hereinafter) of the subtracter 28 by the division data stored in the memory 27. The data conversion circuit 26 outputs a division result (may be referred to as "second correction data HD2" hereinafter) of the divider 29 as the lower data DL.

Figure 7:
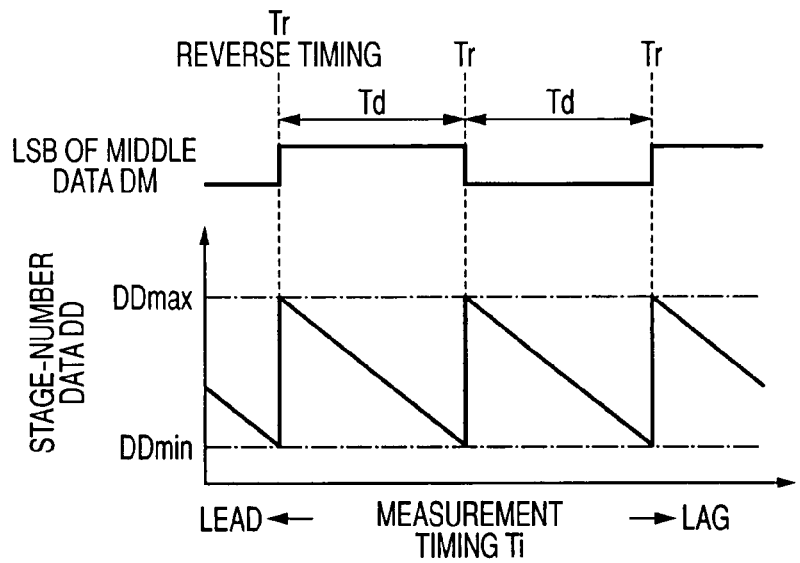
FIG. 7 is an explanatory view showing a relationship among stage-number data, reverse timing, and measurement timing.

Hence, as shown in FIG. 7, the stage-number data DD generated by the encoder 25 takes its minimum value DDmin when a reverse timing Tr at which any one of the outputs of the delay units DU reverses (at the timing at which the LSB of the middle data DM reverses), and the measurement timing Ti agree with each other, and takes its maximum value DDmax at a moment when the measurement timing Ti lags behind the reverse timing Tr. As this time lag increases, in other words, when the time lead of the measurement timing Ti with respect to the reverse timing Tr decreases, the stage-number data DD decreases. That is, the value of the stage-number data DD varies in sawtooth wave form with the change of the measurement timing Ti.

The minimum value DDmin becomes 0, if the reverse timing Tr and an input timing at which the reverse timing signal PR is inputted to the first delay line 21 exactly coincide with each other. Actually, since the input timing lags behind the reverse timing due to the presence of the reverse timing extraction circuit 13, the minimum value DDmin does not become 0, that is, the so-called offset arises.

The difference between the maximum value DDmax and the minimum value DDmin is equal to M−1 if the delay time difference $\Delta T$ (=Td2−Td1) between the delay time of the delay unit DU1 and the delay time of the delay unit DU2 is exactly equal to Td/M. If $\Delta T$>Td/M, DDmax−DDmin≧M−1, and if $\Delta T$<Td/M, DDmax−DDmin≦M−1. Hence, an error of the delay time difference $\Delta T$ becomes a gain error of the stage-number data DD, which changes the slope of the stage-number data DD shown in FIG. 7.

Since the value of the stage-number data DD decreases as the time lag of the measurement timing Ti with respect to the reverse timing Tr increases, it has to be converted such that its value increases as the time lag increases to generate the lower data DL.

Figure 8:
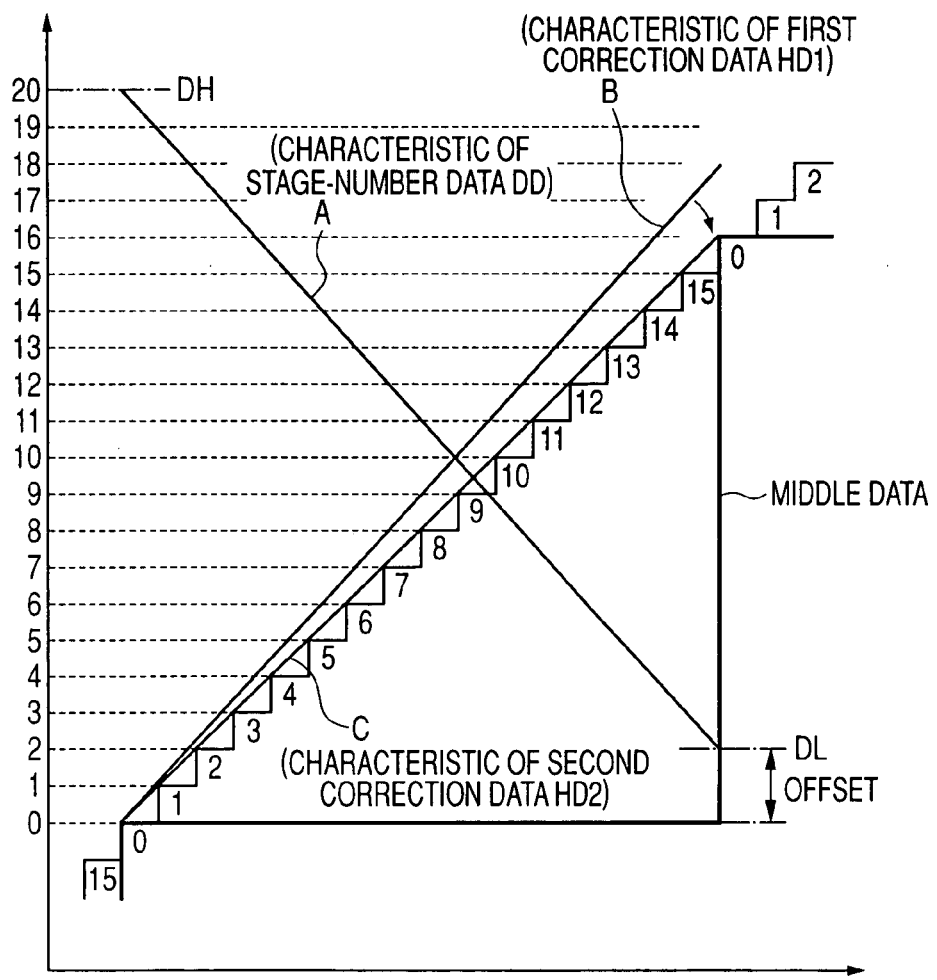
FIG. 8 is an explanatory view explaining the operation of a data conversion circuit included in a lower coding section included in the interpolation circuit shown in FIG. 5.

Accordingly, the data conversion circuit 26 obtains the first correction data HD1 having the characteristic shown by the straight line B in FIG. 8 in accordance with the following equation (2) using the maximum value DDmax as the offset data, so that the offset is removed, and the stage-number data DD having the characteristic shown by the straight line A in FIG. 8 is converted such that its value monotonously increases with the increase of the time lag of the measurement timing Ti with respect to the reverse timing Tr.

$$HD1 = DDmax - DD \quad (2)$$

In addition, the data conversion circuit 26 further obtains the second correction data HD2 having the characteristic shown by the straight line C in FIG. 8 in accordance the following equation (3), so that the first correction data HD1 having the characteristic shown by the straight line B in FIG. 8 is converted such that the lower data DL is in a value range from 0 to M−1.

$$HD2(=DL) = HD1 \times M/(DDmax - DDmin) \quad (3)$$

Incidentally, since the maximum value DDmax of the stage-number data DD varies depending on the offset and the gain error, it is necessary to determine the stage numbers of the delay units DU1, DU2 taking account of the offset and the gain error.

As explained above, the time measuring apparatus of this embodiment, which includes, as a main scale, the pulse delay circuit 11, the latch/encoder 12, the circulation number counter 15 and the latch circuit 16, and includes, as a vernier, the reverse timing extraction circuit 13 and the interpolation circuit 14, measures (digitizes), by use of the main scale, the time interval between the two successive measurement timings of the signals PB in a resolution equal to the delay time of each one of the delay units DU, and measures (digitizes), by use of the vernier, the time interval between the reverse timing Tr of the delay units DU and the measurement timing in a resolution M times finer than the resolution of the main scale.

The interpolation circuit 14, which includes the first delay line 21 constituted by the plurality of the delay units DU1 each having the delay time Td1, and the second delay line 22 constituted by the plurality of the delay units DU2 each having the delay time Td2 which is larger than the delay time Td1 by $\Delta T$ (=Td/M), is configured such that the resolution of the vernier is determined not by the delay times of the delay units DU1, DU2, but by the delay time difference $\Delta T$ between the delay time of the delay unit DU1 and the delay time of the delay unit DU2.

According to this embodiment, it is possible to digitize the time intervals of the successive measurement timings of the measurement signals PB at high speed and in high resolution without using any complicated analog circuits and the CMOS design rule fine patterns.

In this embodiment, as shown in FIG. 4, the reverse timing extraction circuit 13 is constituted by the flip-flops DFF, the OR circuit OR, and the enabling signal generating circuit 19. However, this reverse timing extraction circuit 13 have a problem in that the flip-flop circuits DFF may become unstable depending on a timing at which the measurement signal PB applied to the data input terminals thereof changes its value. This causes the delay time of the flip-flop circuits DFF to vary, which prevents the reverse timing extraction circuit 13 to stably output the reverse timing signal PR.

Figure 9:
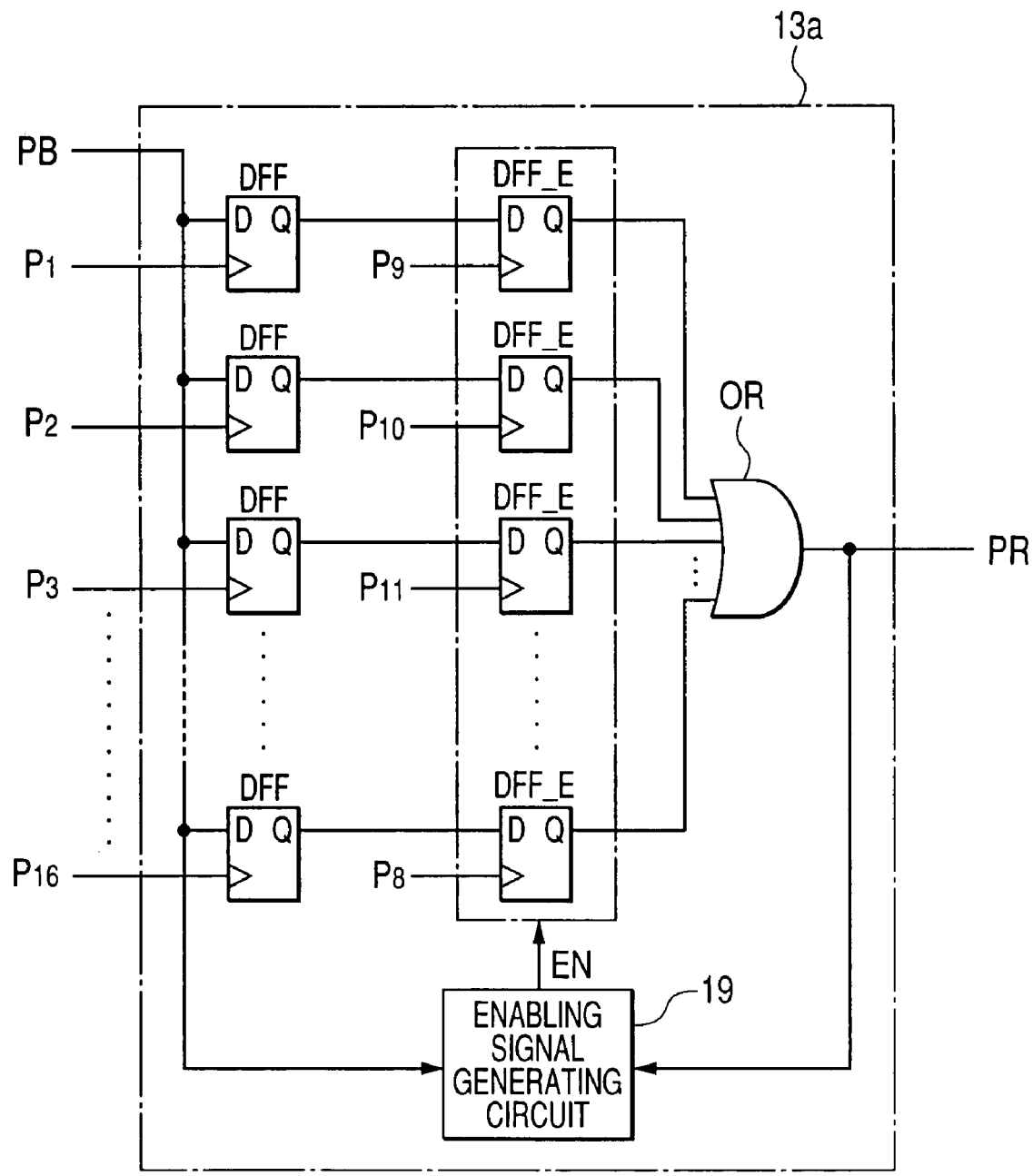
FIG. 9 is a circuit diagram of a variant of the reverse timing extraction circuit included in the digitization section shown in FIG. 2.

To cope with this problem, instead of the reverse timing extraction circuit 13 shown in FIG. 4, a different reverse timing extraction circuit 13a shown in FIG. 9 may be used. As shown in this figure, the reverse timing extraction circuit 13a additionally includes flip-flop circuits DEF_E disposed in the rear of the flip-flop circuits DEF in a one-to one relationship. Each flip-flop circuit DEF_E is applied with the output of the corresponding flip-flop circuit DEF at its data input terminal, applied with, at its clock input terminal, one of the outputs P1 to PL, which is phase-shifted by 180 degrees with respect to another one of the outputs P1 to PL applied to a clock input terminal of the flip-flop-circuit DFF preceding to this corresponding flip-flop circuit DEF, and applied with the inverted version of the output of the OR circuit OR (that is, reverse timing signal PR) at its enable input terminal. The outputs of the flip-flop circuits DEF_E are inputted to the OR circuit OR. The reverse timing extraction circuit 13a may be configured such that the enable signal EN is applied to a selected one of the flip-flop-circuits DFF and the flip-flop circuits DEF_E.

In the reverse timing extraction circuit 13a, the delay time variation of the flip-flop circuits DFF on the front side does not affect the reverse timing signal PR. The time lag of the reverse timing signal PR with respect to the reverse timing shown by the outputs of the delay units DU increases by the delay time of the flip-flop circuits DEF_Eon the rear side. However, since the delay time of the flip-flop circuits DEF_E is made constant, it is possible to cause the interpolation circuit 14 to generate the lower data DL with a high degree of accuracy by providing a delay circuit having the same constant delay time as the flip-flop circuits DEF_E for delaying the measurement signal PB.

In the case where the delay unit DU is constituted by CMOS inverter gate circuits, the drive voltage (power supply voltage) of the delay unit DU is preferably set at a value smaller than a sum of a threshold voltage of an N-channel transistor and a threshold voltage of a P-channel transistor which constitute the CMOS inverter gate circuit, so that electric power consumption per delay unit can be very small. Although the delay time of the delay unit DU increases as the drive voltage thereof decreases, this embodiment makes it possible to satisfy both the reduction of power consumption and the high output resolution because of the provision of the vernier.

The size of transistors constituting the delay unit DU1 of the first delay line 21, and the delay unit DU2 of the second delay line 22 is preferably larger than twice the size of transistors constituting the delay unit DU of the pulse delay circuit 11, so that production variations in the delay characteristics of the first delay line 21 and the second delay line 22 become small, to thereby increase the accuracy of the vernier.

Second Embodiment

Figure 10:
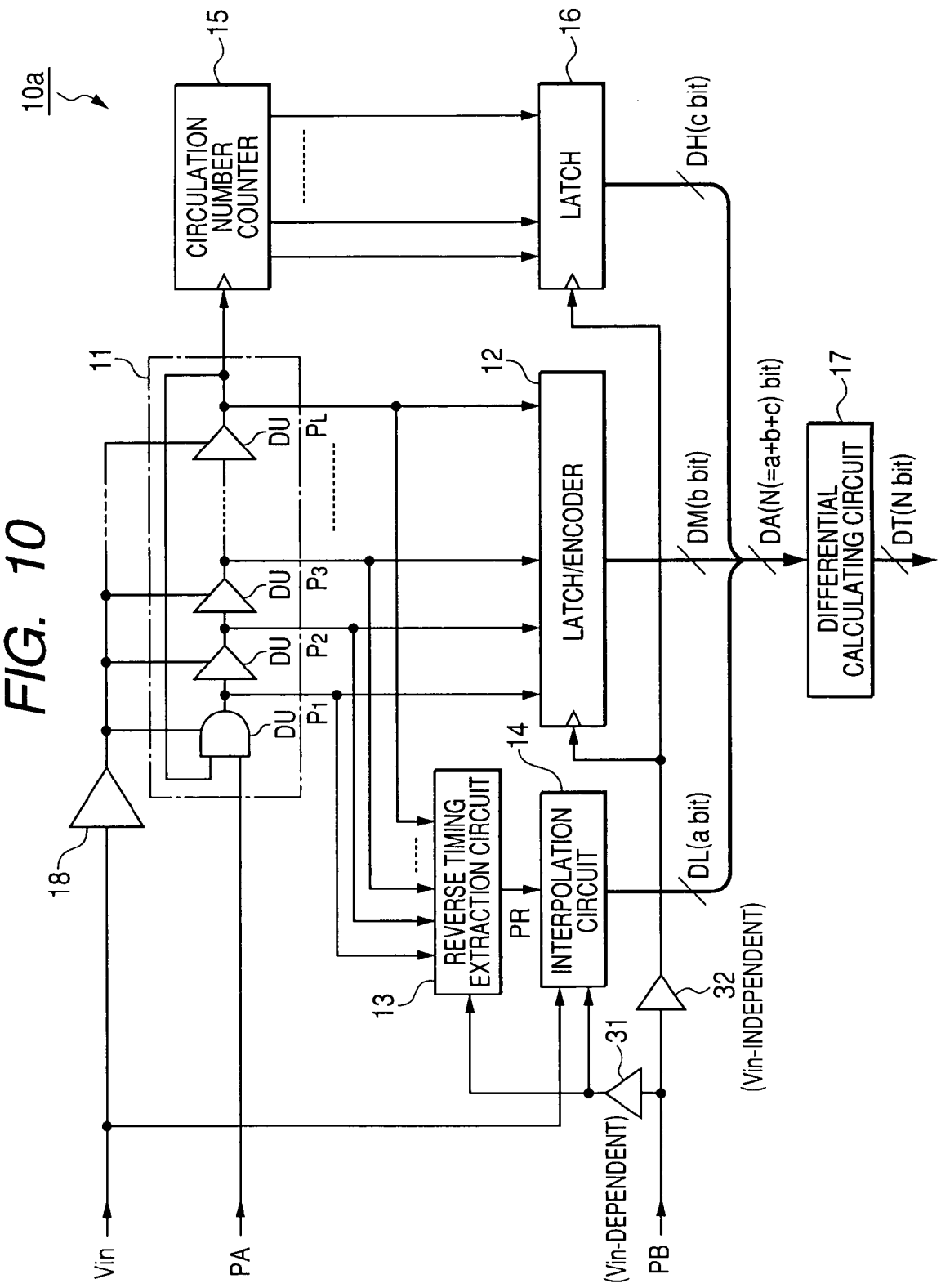
FIG. 10 is a block diagram showing an overall structure of a time measuring apparatus including a digitization section according to a second embodiment of the invention.

Next, a second embodiment of the invention is explained. The following explanation focuses on a difference between the second embodiment and the first embodiment, which resides in the structures of their digitization sections. FIG. 10 is a block diagram showing the structure of a digitization section 10a included in a time measuring apparatus according to the second embodiment of the invention.

As shown in FIG. 10, the digitization section 10a is provided with a delay circuit 31 (which may be a single delay unit DU) disposed on a signal path for supplying the measurement signal PB to the interpolation circuit 14 and the reverse timing extraction circuit 13, and a delay circuit 32 disposed on a signal path for supplying the measurement signal PB to the latch/encoder 12 and the latch 16. The delay characteristic of the delay circuit 31 with respect to the drive voltage and the temperature is the same as that of the delay units DU constituting the pulse delay circuit 11. The delay characteristic of the delay circuit 32 is independent of the drive voltage and the temperature.

The time measuring apparatus of this embodiment can cancel the variation of the resolution (time width of one LSB) of the output (middle data) of the latch/encoder 12 resulting from the variation of the delay time of the delay units DU depending on the drive voltage and the temperature, in order to generate the output data DT with a high degree of accuracy not affected by the drive voltage variation and the temperature variation.

The delay circuit 32 is for adaptation to the provision of the delay circuit 31.

Third Embodiment

Figure 11:
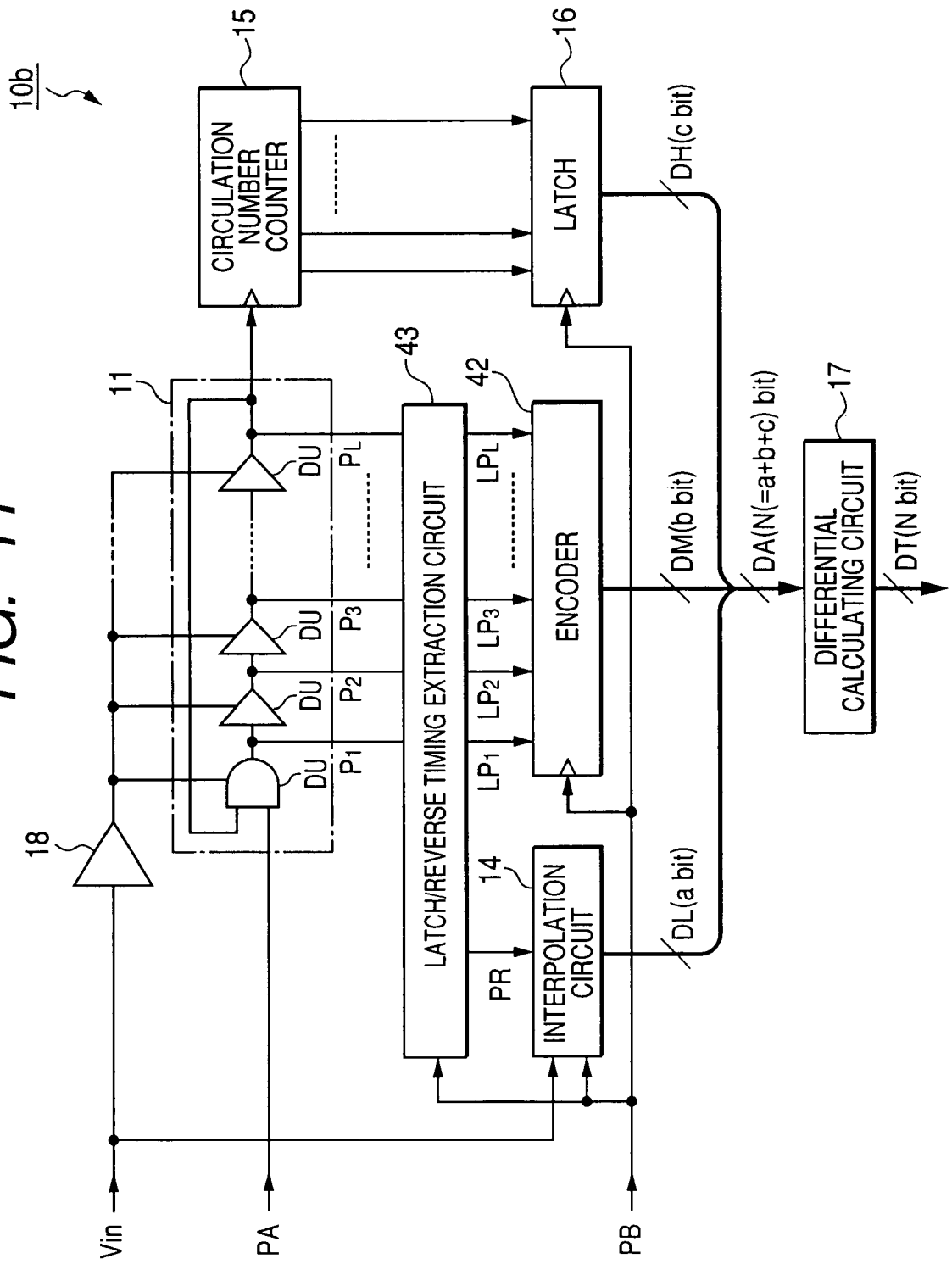
FIG. 11 is a block diagram showing a structure of digitization section included in a time measuring apparatus according to a third embodiment of the invention.

Next, a third embodiment of the invention is explained. The following explanation focuses on a difference between the third embodiment and the first embodiment, which resides in the structures of their digitization sections. FIG. 11 is a block diagram showing a structure of a digitization section 10b included in a time measuring apparatus according to the third embodiment of the invention.

As shown in FIG. 11, the digitization section 10b includes, instead of the latch/encoder 12 and the reverse timing extraction circuit 13, a latch/reverse timing extraction circuit 43, and an encoder 42. The latch/reverse timing extraction circuit 43 is configured to latch the outputs P1 to PL of the delay units DU constituting the pulse delay circuit 11 at the measurement timing Ti of the measurement signal PB, and generate the reverse timing signal PR representing a timing at which any one of the outputs P1 to PL of the delay units DU reverses for the first time after the measurement signal PB is inputted on the basis of the latched outputs P1 to PL. The encoder 42 is configured to output b-bit digital data (middle data) DM representing in what stage number of the delay units DU the pulse signal is on the basis of the outputs P1 to PL latched by the latch/reverse timing extraction circuit 43.

Figure 12:
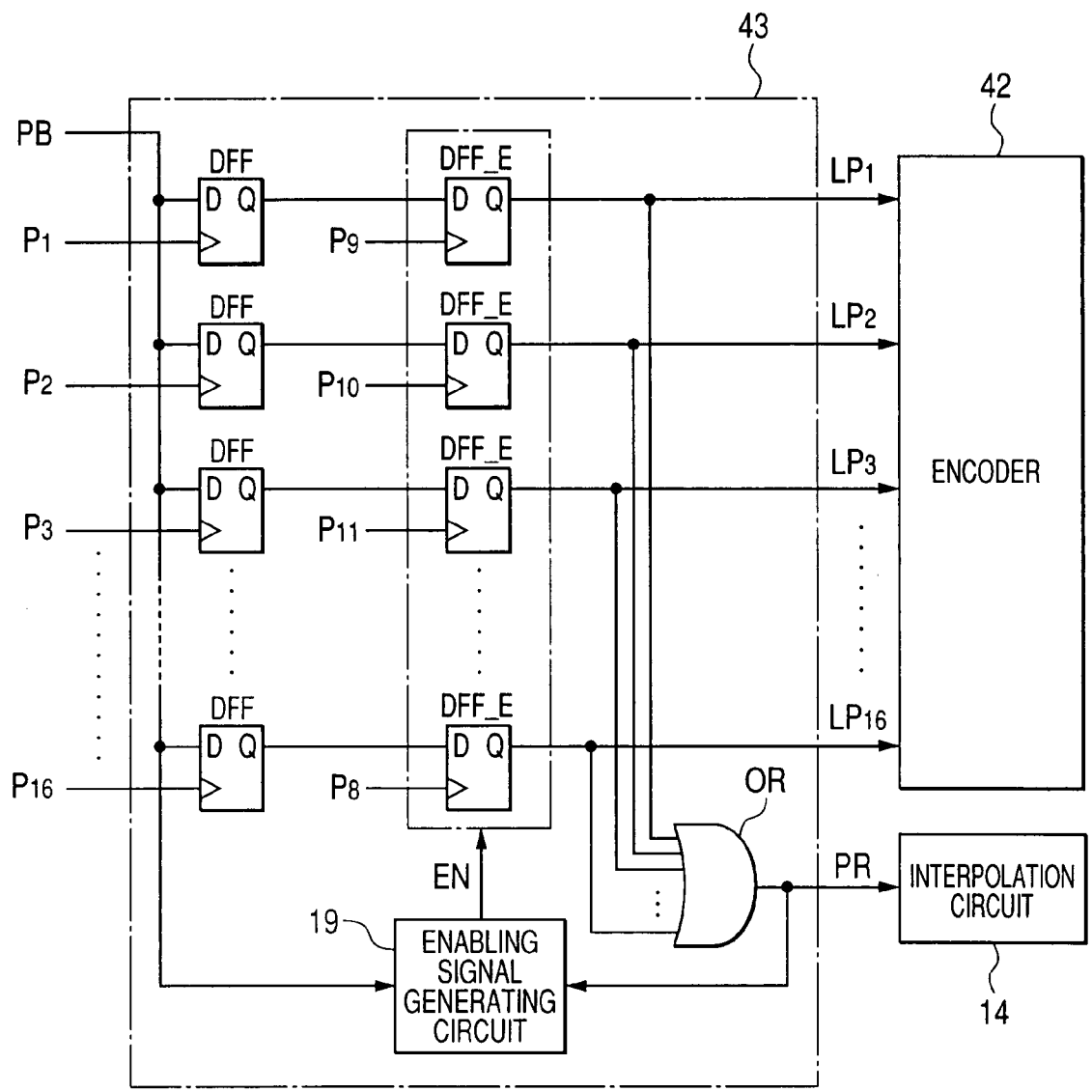
FIG. 12 is a circuit diagram showing a structure of a latch/reverse timing extraction circuit included in the digitization section shown in FIG. 11.

As shown in FIG. 12, the latch/reverse timing extraction circuit 43 includes front-side flip-flop circuits DFF, rear-side flip-flop circuits DFF_E, an OR circuit OR, and a enabling signal generating circuit. The outputs of the rear-side flip-flop circuits DFF_E are supplied to the encoder 42 as the latch results LP1 to LPL.

According to this embodiment, the circuit scale of the time measuring apparatus 1 can be made small, because the same latch circuit can be shared in this embodiment, compared to the first embodiment in which the latch/encoder 12 and the reverse timing extraction circuit 13 have a latch circuit individually. In addition, since the encoder 42, and the OR circuit OR generating the reverse timing signal PR (and consequently the interpolation circuit 14) are provided with the output of the same latch circuit, it is possible to make a point at which the LSB of the middle data DM generated by the encoder 42 changes coincide with a point at which the stage-number data changes from DDmin to DDmax (see FIG. 7) in order to improve the accuracy of the lower data DL.

The digitization section 10b of this embodiment may be provided with the delay circuits 31, 32 explained in the second embodiment.

Fourth Embodiment

Next, a fourth embodiment of the invention is explained.

Figure 13:
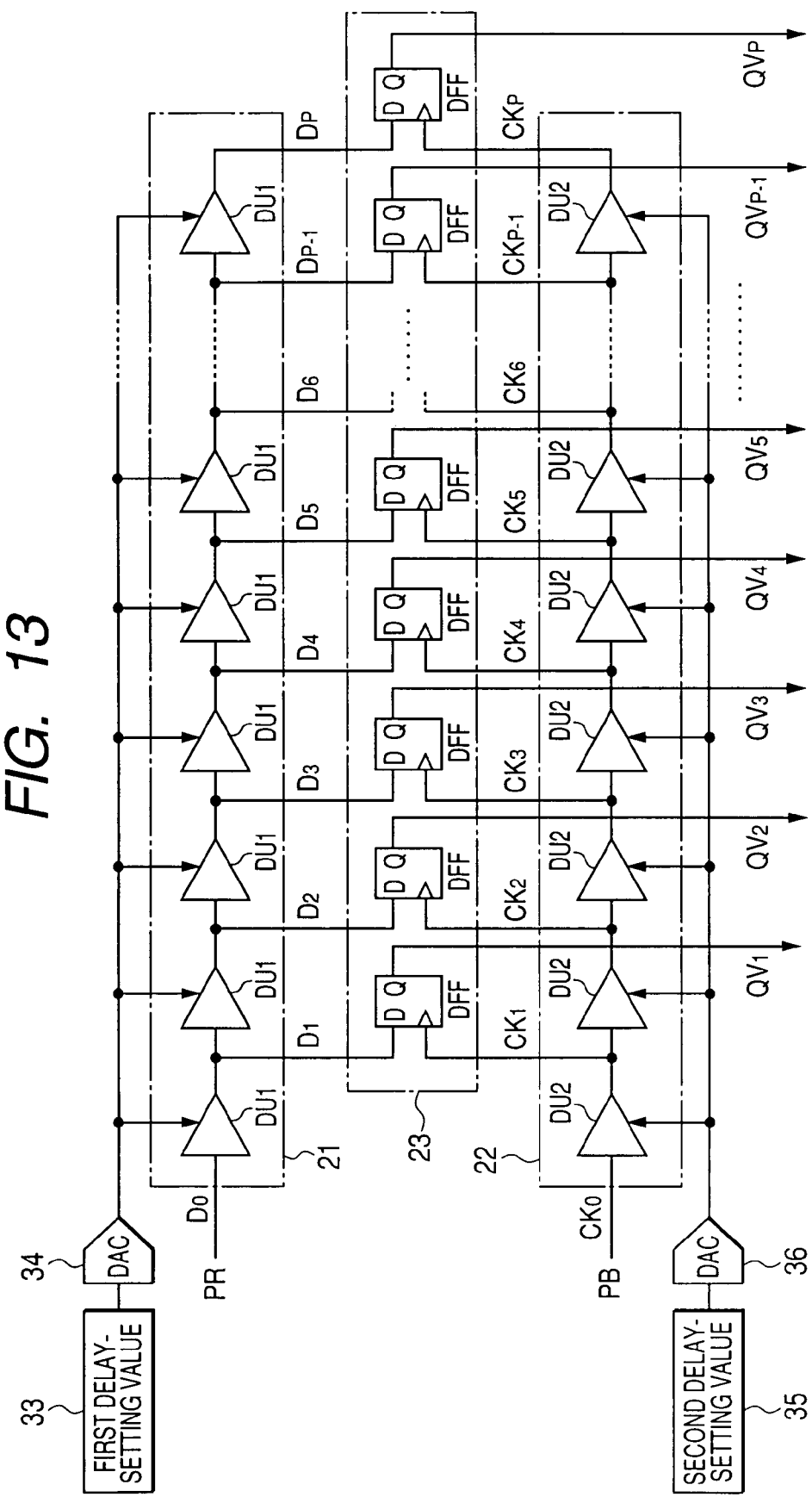
FIG. 13 is a circuit diagram showing a structure around a first delay line and a second delay line of an interpolation circuit of a digitization section included in a time measuring apparatus according to a fourth embodiment of the invention.

The following explanation focuses on a difference between the fourth embodiment and the first embodiment, which resides in the structures of their first delay line 21 and second delay line 22, and their vicinity. FIG. 13 is a circuit diagram showing a structure around the first delay line 21 and the second delay line 22.

In this embodiment, the delay characteristic of the delay units DU1 constituting the first delay line 21 and that of the delay characteristic of the delay units DU2 constituting the second delay line 22 are made the same with each other. As shown in FIG. 13, this embodiment is provided with a D/A converter 34 generating the drive voltage of the delay units DU1 constituting the first delay line 21 in accordance with a first delay-setting value stored in a register 33, and a D/A converter 36 generating the drive voltage of the delay units DU2 constituting the second delay line 22 in accordance with a second delay-setting value stored in a register 35.

The first and second delay-setting values respectively stored in the registers 33, 35 are set to such values that the D/A converters 34, 36 generate the drive voltages which makes the delay time difference ΔT becomes Td/M.

The first and second delay-setting values may be variably set depending on the surrounding environment (power supply voltage, ambient temperature, etc.) According to this embodiment, since the delay time difference ΔT can be set exactly at Td/M irrespective of production tolerance, the measurement accuracy can be improved. In addition, according to this embodiment, the accuracy of the interpolation circuit 14 can be easily changed by changing the first and second delay-setting values.

Incidentally, since the gain error can be made small in this embodiment, the divider 29 provided in the data conversion circuit 26 for correcting the gain error may be eliminated. Furthermore, since it is not necessary to allow for margin depending on the gain error in the stage numbers of the delay units DU1 constituting the first delay line 21 and the delay units DU2 constituting the second delay line 22, the circuit scales of the first delay line 21 and the second delay line 22 can be reduced.

Fifth Embodiment

Next, a fifth embodiment of the invention is explained.

Figure 14:
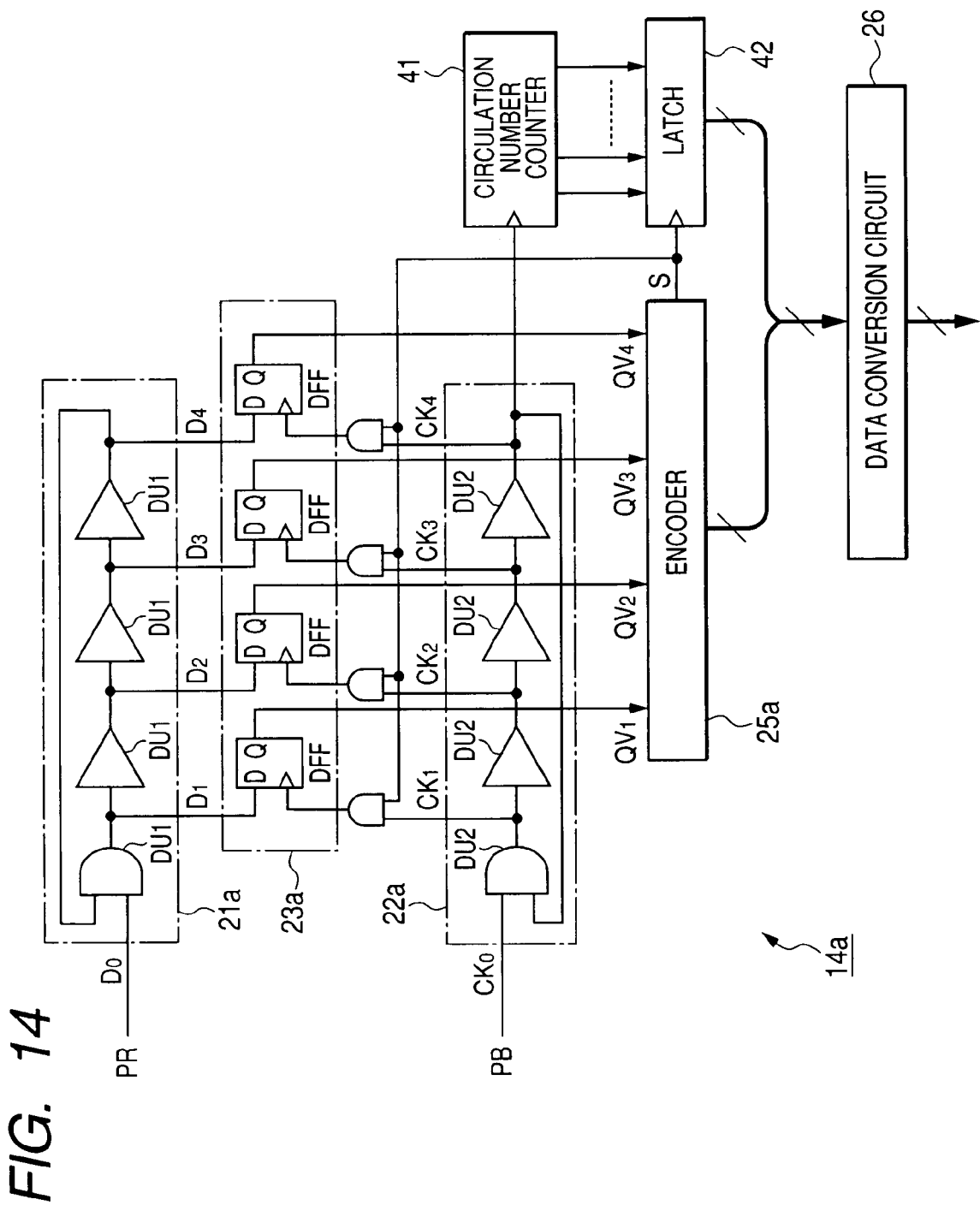
FIG. 14 is a circuit diagram showing an overall structure of an interpolation circuit of a digitization section included in a time measuring apparatus according to a fifth embodiment of the invention.

The following explanation focuses on a difference between the fifth embodiment and the first embodiment, which resides in the structures of their interpolation circuits. As shown in FIG. 14, the interpolation circuit 14a in this embodiment includes a first delay line 21a constituted by the delay units DU1 connected in ring form, and a second delay line 22a constituted by the delay units DU2 connected in ring form.

The flip-flop circuits DFF constituting an edge detection circuit 23a are applied with the outputs of the delay units DU1 at their data input terminals, and applied with logical products of the outputs of the delay units DU2 and a circulation stop signal S (to be explained later) at their clock input terminals.

An encoder 25a is configured to change the circulation stop signal S from the high level to the low level upon detecting that any one of the outputs QV1 to QVP of the flip-flop circuits DFF constituting the edge detection circuit 23a reverses (that is, upon detecting the first delay pulse has overtaken the second delay pulse), and generate data representing a position (the stage number of the delay unit DU1, and the delay unit DU2) of these delay pulses in digitized form when the overtaking has occurred.

This embodiment is further provided with a circulation number counter 41 counting the output (the circulating pulse signal) of the final stage delay unit DU2 of the second delay line 22a, and a latch circuit 42 latching the count value of the circulation number counter 41 at a rising edge of the circulation stop signal S outputted from the encoder 25a.

The data conversion circuit 26 generates the stage-number data formed by the output of the encoder 25a as its lower bits, and the output of the latch circuit 42 as its higher bits. According to this embodiment where each of the first delay line 21a and the second delay line 22a is formed as a ring delay line, it is possible to substantially reduce the numbers of the delay units DU1 and delay units DU2, to thereby downsize the interpolation circuit 14a, and consequently downsize the time measuring apparatus 1.

Incidentally, the drive voltage supplied to the delay units DU1 constituting the first delay line 21a, and the delay units DU2 constituting the second delay line 22a may be the analog input signal Vin as in the case of the first embodiment, or the output of the D/A converter as in the case of the third embodiment.

Sixth Embodiment

Next, a sixth embodiment of the present invention is explained.

Figure 15A:
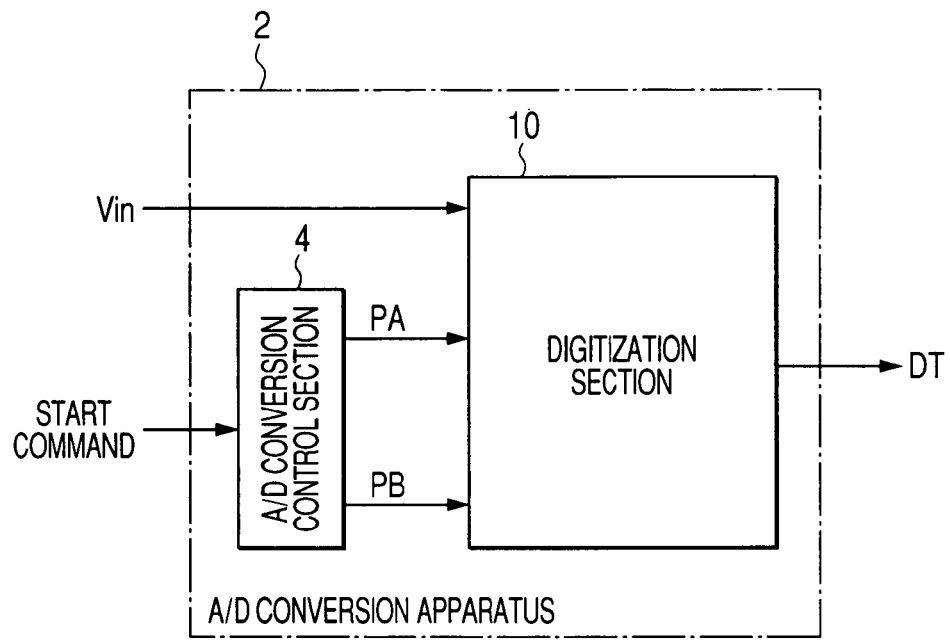
FIG. 15A is a block diagram showing an overall structure of an A/D conversion apparatus including a digitization section according to a sixth embodiment of the invention.
Figure 15B:
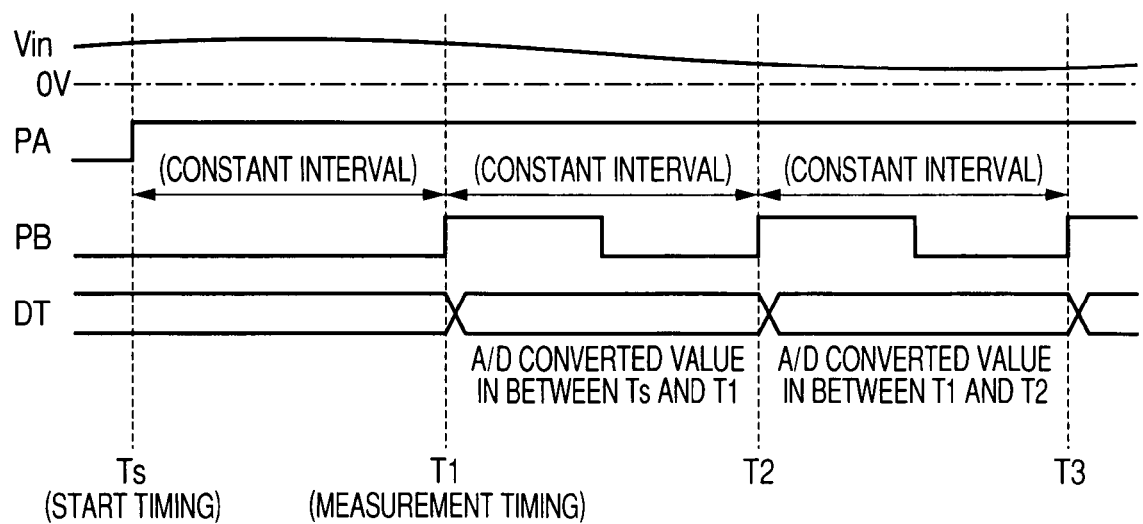
FIG. 15B is a timing diagram showing the operation of the A/D conversion apparatus shown in FIG. 15A.

In the above, the present invention has been described by way of examples where the present invention is applied to the time measuring apparatus, while on the other hand, the present invention is described below by way of an example where the present invention is applied to an A/D converter apparatus 2. FIG. 15A is a block diagram showing an overall structure of the A/D converter apparatus 2. FIG. 15B is a timing diagram showing the operation of the A/D converter apparatus 2.

As shown in FIG. 15A, the A/D converter apparatus 2 includes an A/D conversion control section 4, and a digitization section 10. The A/D conversion control section 4 is configured to output the start signal PA whose signal level changes from a non-active level (low level in this embodiment) to an active level (high level in this embodiment) when the start command is inputted from outside, and the measurement signal PB which rises at constant time intervals after the start timing Ts defined by the start signal PA. The digitization section 10 receives the start signal PA and the measurement signal PB form the A/D conversion control section 4, and outputs the output data DT representing the signal level of the analog input signal Vin in digitized form at the timing Ti (that is, at constant time periods) indicated by the measurement signal PB.

The digitization section 10 in this embodiment is identical in structure with the digitization section 10 in the first embodiment.

It should be noted that the A/D conversion apparatus 2 described above may be provided with any one of the configuration explained in the second to fourth embodiments.

Seventh Embodiment

Next, a seventh embodiment of the invention is explained.

Figure 16:
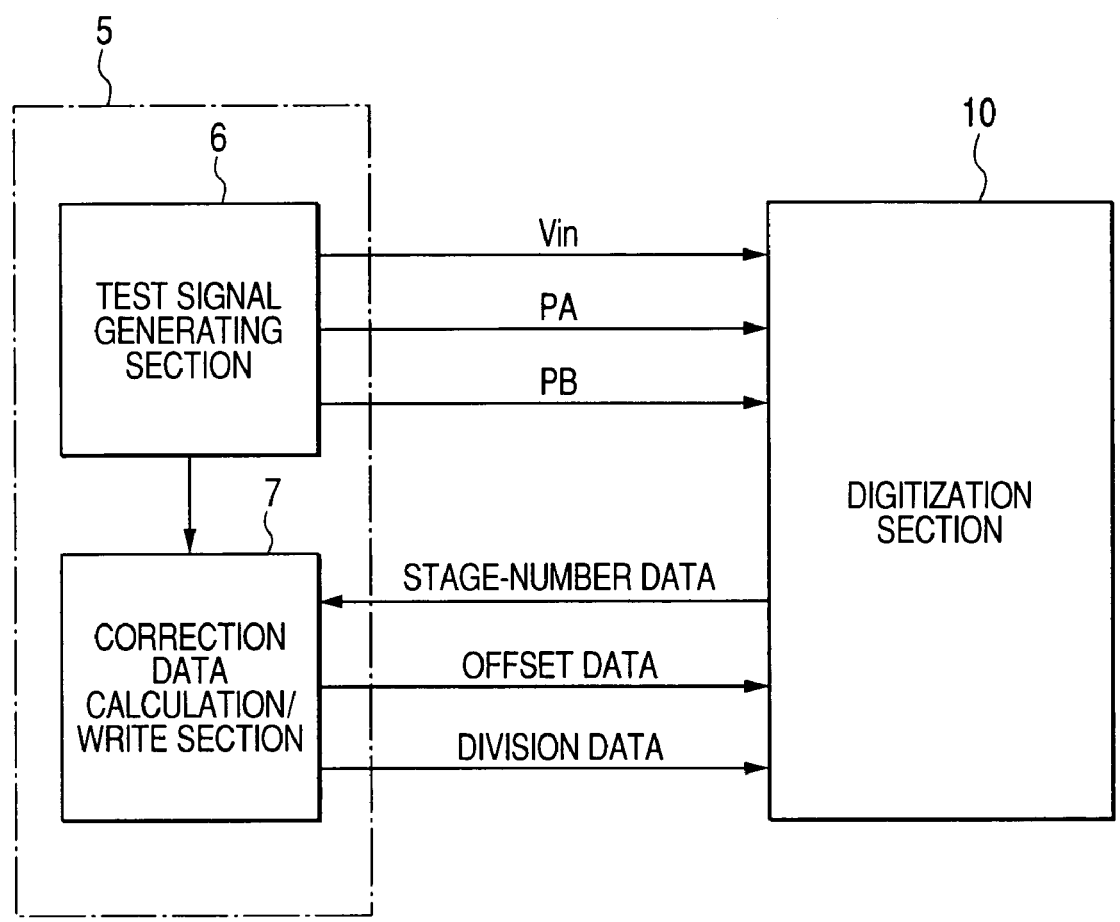
FIG. 16 is a block diagram showing a structure of a calibration circuit provided in a time measuring apparatus or an A/D conversion apparatus including a digitization section according to a seventh embodiment of the invention.

As shown in FIG. 16, the seventh embodiment is not different from the time measuring apparatus 1 or the A/D conversion apparatus 2 described above, except that it is additionally provided with a calibration circuit 5 for automatically renewing the correction data (offset data, division data) stored in the memory 27 of the data conversion circuit 26. In FIG. 16, the time measurement control section 3 and the A/D conversion control section 4 are omitted from illustration.

The calibration circuit 5 includes a test signal generating section 6, and a correction data calculation/write section 7. The test signal generating section 6 is for supplying the digitization section 10 with the analog input signal Vin, start signal PA, and measurement signal PB for test use. The correction data calculation/write section 7 operates to calculate the correction data from the data which the digitization section 10 generates in accordance with the signals supplied from the test signal generating section 6, and renew the contents of the memory 27 by the calculated correction data.

More specifically, the test signal generating section 6 supplies the digitization section 10 with the analog input signal Vin of a constant voltage for a predetermined time period when it receives the start command from outside. In this state, the test signal generating section 6 starts the pulse delay circuit 11 by supplying it with the start signal PA, and thereafter supplies it with the measurement signal PB whose period is modulated so that the temporal relationship between the measurement timings and the reverse timings changes variously.

The correction data calculation/write section 7 takes in the stage-number data DD generated by the encoder 25 of the lower coding section 24 each time the measurement signal PB is inputted thereto. Since the period of the measurement signal PB is modulated, and accordingly the temporal relationship between the measurement timing and the reverse timing changes variously, a group of the stage-number data DD as shown in FIG. 7 is obtained.

The correction data calculation/write section 7 extracts, from the obtained group of the stage-number data DD, its maximum value DDmax and its minimum value DDmin, and stores these values as the offset data, together with the difference therebetween (DDmax−DDmin) as the division data in the memory 27.

According to this embodiment where the correction data (offset data, division data) necessary for the interpolation circuit 14 to generate the lower data DL can be renewed as necessary, it is possible to always keep the degree of accuracy of the lower data DL at high level.

Other Embodiments

Although the pulse delay circuit 11 has been described as being constituted by the delay units DU connected in ring form in the above embodiments, it may be constituted by a series connection of the delay units DU. In this case, the circulation number counter 15 and the latch circuit 16 can be removed.

In the above embodiments, the flip-flop circuits DFF constituting the edge detection circuit 23 are applied with the outputs of the delay units DU1 at their data input terminals, and applied with the outputs of the delay units DU2 at their clock input terminals, they may be applied with the outputs of the delay units DU2 at their data input terminals, and applied with the outputs of the delay units DU1 at their clock input terminals.

In the above embodiments, the delay unit DU is constituted by a series connection of two CMOS inverter gate circuits, it may be constituted by a series connection of three or more CMOS inverter gate circuits. For example, it may be constituted by a series connection of four CMOS inverter gate circuits as shown in (b) of FIG. 16, or by a series connection of eight CMOS inverter gate circuits as shown in (c) of FIG. 16.

The unit-to-unit variation of the delay time of the delay unit DU decreases as the number of the CMOS inverter gate circuits constituting the delay unit DU increases. Accordingly, it is possible to improve the accuracy of digitization by increasing the number of the CMOS inverter gate circuits constituting one delay unit DU.

The above explained preferred embodiments are exemplary of the invention of the present application which is described solely by the claims appended below. It should be understood that modifications of the preferred embodiments may be made as would occur to one of skill in the art.

What is claimed is:

1. A digitization apparatus comprising:
a pulse delay circuit constituted by a plurality of pulse delay units connected in series or in ring form, each of said pulse delay units having a delay time depending on a voltage level of an analog input signal applied thereto as a drive voltage thereof, said pulse delay circuit allowing a pulse signal to travel through said pulse delay units while being successively delayed by said delay time;
a higher coding circuit generating, upon receiving a measurement signal indicating a measurement timing from outside, digitized data representing the number of said pulse delay units which said pulse signal has passed;
a reverse timing extraction circuit extracting a timing, as a reverse timing signal, at which any one of said pulse delay units has reversed in output level for the first time after said measurement timing;
a first delay line constituted by a plurality of first delay units connected in series or in ring form, each of said first delay units having a first delay time, said first delay line allowing said reverse timing signal to travel through said first delay units while being successively delayed by said first delay time;
a second delay line constituted by a plurality of second delay units connected in series or in ring form, each of said second delay units having a second delay time larger than said first delay time by 1/M (M being an integer not smaller than 2) of said delay time of said pulse delay units, said first delay line allowing said reverse timing signal to travel through said second delay units while being successively delayed by said second delay time; and
a lower coding circuit generating digitized data representing a time difference between said measurement timing and said reverse timing on the basis of the number of said first delay units which said reverse timing signal has passed when said number of said first delay units has overtaken the number of said second delay units which said measurement signal has passed;
said digitization apparatus outputting data formed by said digitized data generated by said higher coding circuit as higher bits thereof, and said digitized data generated by said lower coding circuit as lower bits thereof.

2. The digitization apparatus according to claim 1, wherein said first delay units and said second delay units are applied with said analog input signal as a drive voltage thereof.

3. The digitization apparatus according to claim 1, wherein said M is a power of 2.

4. The digitization apparatus according to claim 1 further comprising a time measurement control apparatus generating a constant voltage signal as said analog input signal, and a start signal to cause said pulse signal to start traveling through said pulse delay units of said pulse delay circuit, said digitization apparatus outputting data representing in digitized form a time interval between a start timing indicated by said start signal and said measurement timing each time said measurement signal is inputted to said higher coding circuit.

5. The digitization apparatus according to claim 1 further comprising an A/D conversion control circuit supplying said higher coding circuit with said measurement signal at predetermined constant periods, said digitization apparatus outputting, at said measurement timing indicated by measurement signal, data representing a voltage level of said analog input signal in digitized form.

6. The digitization apparatus according to claim 5 further comprising a differential calculating circuit successively memorizing output data generated by said digitization apparatus, and calculating a difference between said output data generated previous time and said output data generated this time.

7. The digitization apparatus according to claim 1, wherein said lower coding circuit includes an edge detection circuit constituted by a plurality of flip-flop circuits provided in one-to-one relationship with said first delay units and said second delay units, each said flip-flop circuit receiving an output of a corresponding one of said first delay units at one of a data input terminal and a clock input terminal thereof, and receiving an output of a corresponding one of said second delay units at the other of said data input terminal and said clock input terminal thereof, an encoder generating stage-number data representing in digitized form a stage number of one of said flip-flop circuits which has changed an output level thereof, and a data conversion circuit converting said stage-number data to such data whose value monotonously increases with increase of a time difference between said reverse timing and said measurement timing.

8. The digitization apparatus according to claim 7, wherein said data conversion circuit performs at least one of elimination of offset contained in said stage-number data, and correction of a gain error of said stage-number data.

9. The digitization apparatus according to claim 8, further comprising a test signal generating circuit having a function of generating said analog input signal, and generating said measurement signal in continuously changing period, and a correction data calculating circuit calculating correction data needed for said data conversion circuit to perform elimination of said offset or correction of said gain error on the basis of said stage-number data outputted from said encoder when said digitization apparatus operates on said analog input signal, and said measurement signal generated by said test signal generating circuit.

10. The digitization apparatus according to claim 1, wherein a delay circuit having the same characteristic with respect to at least one of drive voltage and ambient temperature with said pulse delay units is provided in an input side of said second delay line.

11. The digitization apparatus according to claim 1, further comprising a first D/A converter generating, from adjustable digital set value, an adjustable drive voltage to be supplied to said first delay units, and a second D/A converter generating, from adjustable digital set value, an adjustable drive voltage to be supplied to said second delay units.

12. The digitization apparatus according to claim 1, wherein each said pulse delay unit is constituted by a series connection of a plurality of inverter gate circuits.

13. The digitization apparatus according to claim 12, wherein each said inverter gate circuit is a CMOS inverter gate circuit, said drive voltage of said pulse delay unit is set at a value smaller than a sum of a threshold voltage of an N-channel transistor and a threshold voltage of a P-channel transistor, which constitute said CMOS inverter gate circuit.

14. The digitization apparatus according to claim 1, wherein a size of transistors constituting each of said first deadly units and said second delay units is larger than twice a size of transistors constituting each of said delay units constituting said pulse delay circuit.

15. The digitization apparatus according to claim 1, wherein said reverse timing extraction circuit includes latch circuits latching said measurement signal respectively in synchronization with outputs of said pulse delay units constituting said pulse delay circuit, and an OR circuit outputting a logical sum of outputs of said latch circuits as said reverse timing signal.

* * * * *

UNITED STATES PATENT AND TRADEMARK OFFICE
CERTIFICATE OF CORRECTION

PATENT NO.       : 7,450,049 B2
APPLICATION NO.  : 11/803392
DATED            : November 11, 2008
INVENTOR(S)      : Shigenori Yamauchi et al.

Page 1 of 1

It is certified that error appears in the above-identified patent and that said Letters Patent is hereby corrected as shown below:

Col. 16, line 36, claim 14, "deadly" should be --delay--

Signed and Sealed this

Seventeenth Day of February, 2009

JOHN DOLL
*Acting Director of the United States Patent and Trademark Office*